United States Patent [19]

Asprey

[11] Patent Number: 5,306,965
[45] Date of Patent: Apr. 26, 1994

[54] PROCESS COMPENSATING VARIABLE IMPEDENCE I/O DRIVER WITH FEEDBACK

[75] Inventor: Thomas A. Asprey, Boulder, Colo.

[73] Assignee: Hewlett-Packard Co., Palo Alto, Calif.

[21] Appl. No.: 907,362

[22] Filed: Jul. 1, 1992

[51] Int. Cl.$^5$ .......................................... H03K 19/20
[52] U.S. Cl. ................................... 307/448; 307/443; 307/263
[58] Field of Search ............... 307/448, 443, 451, 263, 307/542.1

[56] References Cited

U.S. PATENT DOCUMENTS

| | | | |
|---|---|---|---|
| 4,777,389 | 10/1988 | Wu | 307/443 |
| 4,779,013 | 10/1988 | Tanaka | 307/443 |
| 4,880,997 | 11/1989 | Steele | 307/263 |
| 5,015,880 | 5/1991 | Drake | 307/263 |
| 5,091,658 | 2/1992 | Pribyl | 307/443 |
| 5,153,457 | 10/1992 | Martin | 307/443 |

Primary Examiner—Edward P. Westin
Assistant Examiner—Andrew Sanders

[57] ABSTRACT

An integrated circuit output driver circuit is disclosed. The output driver varies the impedance of the driver circuit based upon the output voltage level present on the output pad. In that manner, the output driver circuit compensates for process variations and operating conditions. Two FETs are used in parallel to pull the voltage level of the output pad down. One FET is turned on and left on whenever a low voltage level in the output pad is desired. The other smaller FET is used to vary the total impedance of the driver by using feedback from the signal pad to sense when the pad voltage has reached a threshold level at that point the second FET is turned off.

13 Claims, 9 Drawing Sheets

PROCESS COMPENSATING VARIABLE IMPEDENCE I/O DRIVER WITH FEEDBACK

FIELD OF THE INVENTION

The present invention relates generally to communications between integrated circuits and more particularly to driver circuits which drive the communication lines between integrated circuits.

RELATED ART

Modern integrated circuits commonly come in the form of chips. The integrated circuits within a chip communicate with the world outside the chip through metalization layers on the outside of the chip known as signal pads. For communication from within the chip to the world outside, "driver circuits" drive signals or data through the signal pads on the exterior of the chip. The signal pads of various chips are connected together by signal lines thereby allowing communications between different chips.

The signal pads on a chip are then connected to the packaging of the chip which is then connected to a transmission line on a printed circuit board which runs to another integrated circuit chip or other similar device. The electrical connection from the signal pad through the packaging of the chip to the transmission line contains parasitic inductance and capacitance which interferes with the transmission of the signal from the signal pad. The transmission line itself also contains transmission line characteristics which include capacitance and inductance which also interfere with the transmission of the signal from the signal pad. All of the foregoing add to the load which must be driven by the driver circuit.

Because of the parasitic inductance and capacitance which is present on chip to chip signal interconnections, the driver circuits that drive those signal interconnections must be designed to avoid excessive voltage swings when switching occurs. Excessive voltage swings are known as ringing. Ringing must be avoided while still switching as fast as possible to meet the high speed performance requirements of modern integrated circuits.

In the past, CMOS drivers have utilized NMOS (and-/or PMOS) FET's to drive the signal pad to a voltage level based on a clocked or static input to the driver input. The drive NMOS FET's are turned on or off based on the inputs from inside the chip and stay in that state, regardless of the state of the transmission line being driven.

Due to process variations inherent in the manufacturing process of integrated circuits, different integrated circuits intended to perform the same function can be classified as "slow" or "fast". During the manufacturing process for integrated circuits, variations in certain parameters occur. For example, the doping level, the length of channels in FET's, the thickness of the gate oxide for transistors, the diffusion resistance and other characteristics of integrated circuits vary during the manufacturing process. In other words, two supposedly identical integrated circuits can vary in all of those characteristics. As those characteristics approach the ideal case, the performance of a chip is optimized and that situation shall be referred to as the fast case. In the opposite extreme, as those characteristics stray further and further from the ideal case, the performance of the chip is degraded, specifically, the resistance of the many components within the chip is increased, and that situation will be referred to as the slow case.

Also, variations in voltage and temperature can cause a single chip to behave as if it is fast or slow. For example, when the temperature of an integrated circuit approaches its maximum operating temperature, the resistance of FET's in the integrated circuit increases. It is desirable to have a single driver circuit which can operate effectively and still avoid excessive voltage swings regardless of whether the integrated circuit is fast or slow.

In prior systems the size of the FET's driving the signal interconnects have been limited in size in order to minimize excessive voltage overshoot and undershoot when the process parameters are such that the NMOS FET's own impedance is at a minimum and the interconnects impedance is at its maximum. However, this approach has limited the speed of switching when variations in the process parameters have moved these impedances to the opposite case.

This approach has caused an additional problem in system timing. It has increased the uncertainty of placement of the switching transition in time. This has limited the system frequency and causes a degradation in performance.

A typical driver circuit as described above is shown in FIG. 1. The signal pad 102 in this case example is only used for driving signals out from the chip. FET 104 acts like an on/off switch and is controlled by line 106, labeled PULLUP CONTROL. When line 106 is in its high state (a digital 1) FET 104 acts like a switch turned on and pulls line 108, which drives signal pad 102, to voltage level Vdl (a digital 1 or "high") present at point 110. The actual voltage attained by the signal pad is designated Voh. Voh may vary from Vdl due to, for example, leakage current from the device being driven by the signal pad 102.

FET 112 is used to pull line 108 to ground 116 (0 volts). Line 114, labeled PULLDOWN CONTROL is applied to the gate of FET 112. When line 114 is in its high state (at a digital logic 1), FET 112 acts like a switch in the on position and line 108 is pulled towards ground (a digital 0 or "low"). The actual low voltage attained by the signal pad is designated Vol. Vol may be slightly higher than ground due to, for example, leakage current from the device being driven by the signal pad 102.

Signal pad 102 can also be put into a tri-state mode which occurs when both line 106 and line 114 are at low logic levels and therefore both FET 104 and FET 112 act like switches in the off position and therefore line 108 is tri-stated. This could be used if pad 102 is also used to receive signals (input).

The PULLUP CONTROL signal present on line 106 is a function of the signals TRI-STATE CONTROL, DATA TO BE DRIVEN, and CLOCK. The logical expression which defines the PULLUP CONTROL signal can be expressed as follows:

$$\overline{(\text{TRI-STATE CONTROL})} \bullet \text{DATA TO BE DRIVEN} \bullet \text{CLOCK} = \text{PULLUP CONTROL}$$

(wherein the symbol "•" represents the logical AND function).

That logical equation is implemented in the portion of the logic circuits 125 shown in FIG. 1 which generate the PULLUP CONTROL signal. The PULLDOWN CONTROL signal present on line 114 is also a function of the signals TRI-STATE CONTROL, DATA TO BE DRIVEN, and CLOCK. The logical expression which defines PULLDOWN CONTROL is as follows:

$$\frac{1}{\text{(TRI-STATE CONTROL)}} \bullet \frac{1}{\text{DATA TO BE DRIVEN}} \bullet \text{CLOCK} = \text{PULLDOWN CONTROL}$$

(wherein the symbol "•" represents the logical AND function).

FIG. 2 is a timing diagram showing the timing of the signals CLOCK and PULLDOWN CONTROL and the voltage present on the signal pad 102. FIG. 2 represents the slow case defined previously. During the clock pulse 202, the PULLDOWN CONTROL signal 204 goes high (a logical 1). FET 112 then operates as a switch in the on position and attempts to pull line 108 to ground. The voltage present on the signal pad represented by line 206 is then drawn down towards ground, to Vol. The irregularity 208 in line 206 is caused by reflection in the transmission line. The transition of the voltage present on signal pad 102 from Voh to Vol is relatively slow because of the high impedance of FET 112 in the slow case. The impedance of FET 112 would be high in the slow case because of high operating temperatures or due to process variations in the manufacturing of the chip.

FIG. 3 is a timing diagram again showing the signals CLOCK and PULLDOWN CONTROL and the voltage present on the signal pad 102. FIG. 3 represents the "fast" case, also previously defined. During clock pulse 303, the voltage of the PULLDOWN CONTROL signal represented by line 304 is at the high level. When the pulldown control signal is high, FET 112 again acts like a switch in the on position creating a connection from line 108 to ground 116. The voltage level on the signal pad represented in FIG. 3 by the line 306 is pulled to Vol. The irregularity 310 in the voltage present on the signal pad indicated by line 304 is caused by reflection of the transmission line connected to the signal pad. Undershoot (voltage below ground) 308 is caused by the parasitic inductance and capacitance in the connections from the signal pad to the transmission line and to a lesser degree from the characteristics of the transmission line being driven by the signal pad. Bounce 311 is a result of the undershoot 308 and can cause communication errors.

Both the slow response of signal pad 102 shown in FIG. 2 and the undershoot and bounce of the voltage on the signal pad 102 shown in FIG. 3 degrade the performance of and can cause errors in communication between chips. It is desirable to have a driver circuit which would both improve the speed of the response of the case represented in FIG. 2 and minimize the undershoot in the case represented by FIG. 3.

SUMMARY OF THE INVENTION

The present invention is an output driver for an integrated circuit. The present invention varies the impedance of the driver circuit based upon the output voltage level present on the output pad. Therefore, the output drive partially compensates for process variations and interconnect parasitic.

In the preferred embodiment this is accomplished by using two smaller FET's to pull the voltage of the driver output pad. One of the smaller FET's is controlled in the same manner as the single FET is controlled in earlier designs. That FET is simply turned on when the output is to be driven low and stays on. The other smaller FET is used to vary total impedance of the driver by using feedback from the signal pad to sense when pad voltage has reached a threshold level and to then turn off the second driver FET.

The foregoing and other objects, features and advantages of the present invention will become apparent from the following detailed description when taken in conjunction with the accompanying drawings.

DETAILED DESCRIPTION OF THE PREFERRED EMBODIMENTS

Figure 4:
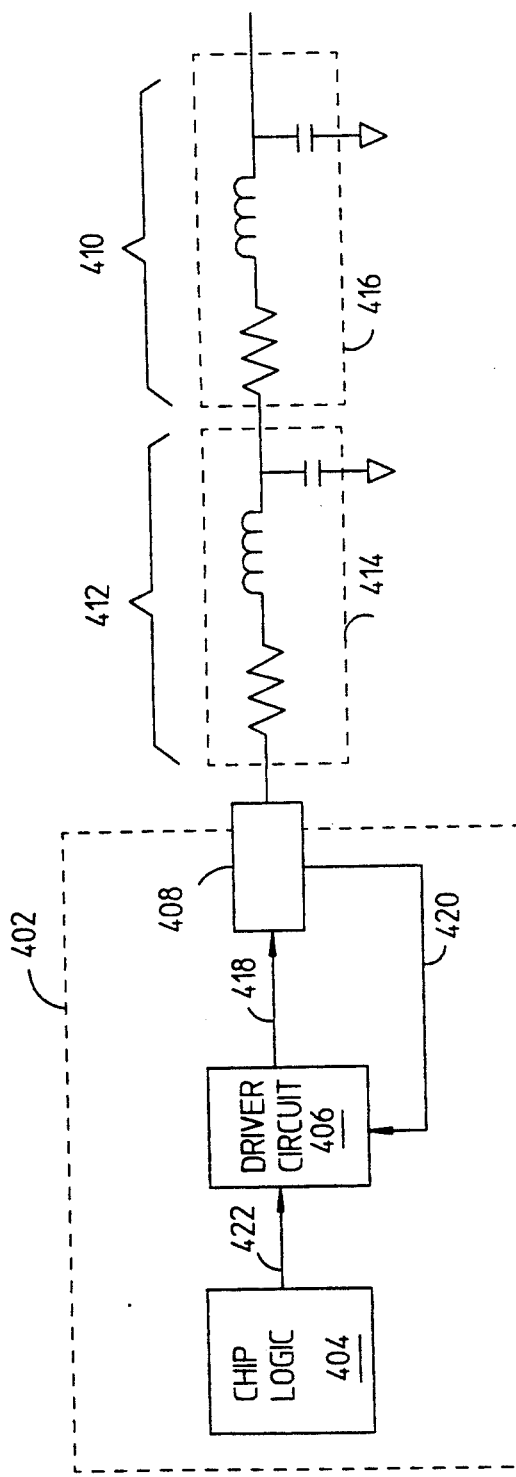
FIG. 4 is a block diagram of a preferred embodiment of the present invention and its operating environment.

FIG. 4 is a block diagram of an integrated circuit 402 which contains a preferred embodiment of the present invention. The box labeled CHIP LOGIC 404 indicates the circuitry of integrated circuit 402 excluding the driver circuit 406 and the signal pad 408. The signal pad 408 is connected to transmission line 410 via the packaging connection 412. The box labeled 414 represents the parasitic capacitance and inductance of the packaging connection 412 and any associated resistance. The box labeled 416 represents the characteristics of the transmission line 410. Transmission line 410 provides a signal path to the input of another integrated circuit or similar device to which integrated circuit 402 sends data.

Driver circuit 406 receives inputs from chip logic 404. The inputs preferably include a clock signal and data to be transmitted or driven to pad 408. Chip logic 404 may also supply a tri-state signal to driver circuit 406. Driver circuit 406 drives a signal via line 418 through signal pad 408. The driver circuit receives a feedback signal over line 420 from signal pad 408.

Figure 5:
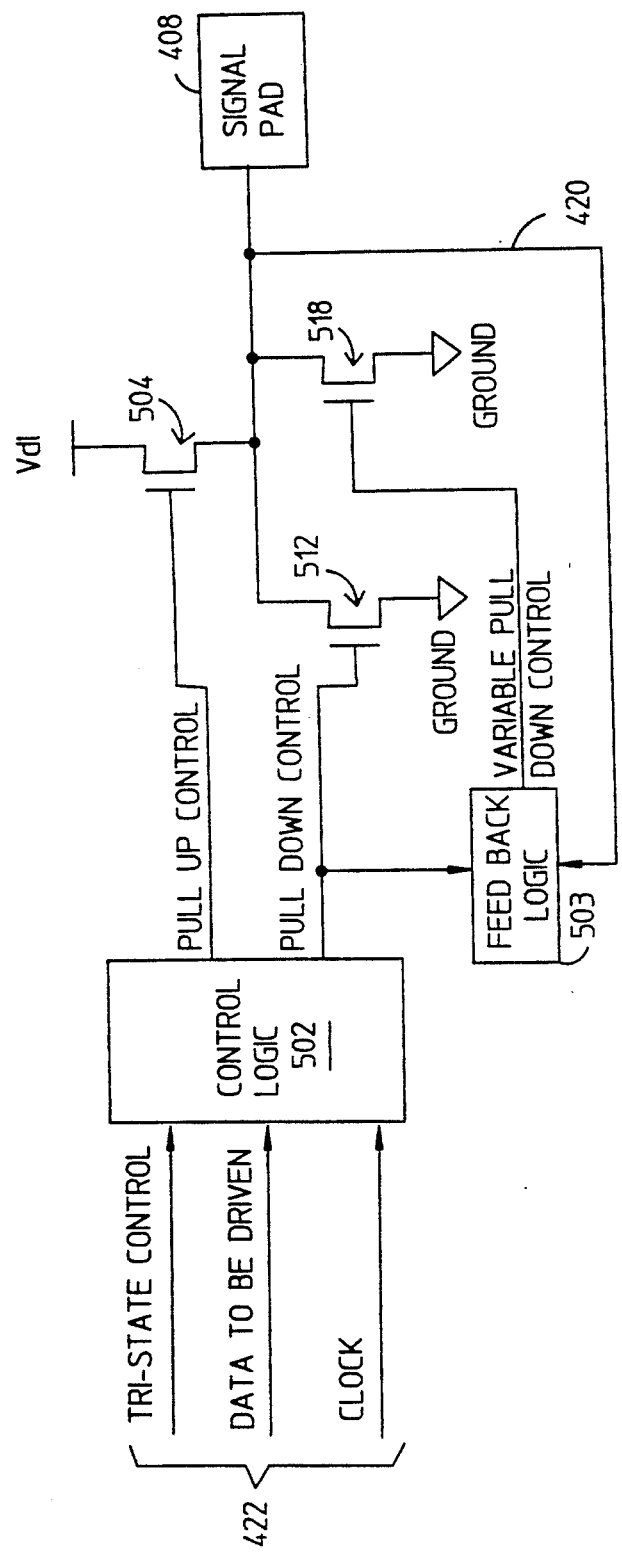
FIG. 5 is a block diagram of a preferred embodiment of the present invention.

FIG. 5 shows a preferred embodiment of the driver circuit, the signal pad and the associated interconnections in more detail. The control logic 502 receives the signals TRI-STATE CONTROL, DATA TO BE DRIVEN, and CLOCK from the chip logic 404 shown in FIG. 4. In a preferred embodiment of the present invention, the control logic 502 contains the logical circuit in the dashed box 125 in FIG. 1.

However, the control logic 502 could be implemented in various other ways and perform additional or different functions without departing from the scope and spirit of the present invention. For example, control logic 502 could be edge triggered, could operate as a static driver (operating without a clock), and/or could incorporate a multiplexer for multiplexing data. Control logic 502 could also receive and respond to inputs other than those shown and still operate within the scope of the present invention.

In a preferred embodiment of the present invention, control logic 502 implements the logic table shown below.

| INPUTS | | | OUTPUTS | |
|---|---|---|---|---|
| Tri-State | Data | Clock | Pull Up | Pull Down |
| 0 | 0 | 0 | 0 | 0 |
| 0 | 0 | 1 | 0 | 1 |
| 0 | 1 | 0 | 0 | 0 |
| 0 | 1 | 1 | 1 | 0 |
| 1 | 0 | 0 | 0 | 0 |
| 1 | 0 | 1 | 0 | 0 |
| 1 | 1 | 0 | 0 | 0 |
| 1 | 1 | 1 | 0 | 0 |

A signal PULL UP CONTROL (labeled "PULL UP" in the logic table above) is connected to the gate of FET 504. When signal PULL UP CONTROL is high (a logical 1) FET 504 operates like a switch in the on position and connects the signal pad to the voltage level Vdl. When signal PULL UP CONTROL is low (a logical 0) FET 504 operates like a switch in the off position and disconnects signal pad 408 from Vdl.

A signal PULL DOWN CONTROL (labeled "PULL DOWN" in the logic table above) is attached to the gate of FET 512. When the signal pull down control is high (a logical 1), FET 512 operates like a switch in the on position and connects signal pad 408 to ground. When the signal PULL DOWN CONTROL is low (a logical 0), FET 512 operates like a switch in the off position and disconnects signal pad 408 from ground.

A signal VARIABLE PULL DOWN CONTROL is connected to the gate of FET 518. When the signal VARIABLE PULL DOWN CONTROL is high (a logical 1), FET 518 acts like a switch in the on position and connects signal pad 408 to ground. When VARIABLE PULL DOWN CONTROL is low (a logical 0), FET 518 operates like a switch in the off position and signal pad 408 sees a high impedance.

The feedback logic 503 generates the VARIABLE PULL DOWN CONTROL signal. The signal VARIABLE PULL DOWN CONTROL is a function of the signal PULL DOWN CONTROL and the feedback from the signal pad carried along line 420.

A preferred embodiment of the circuit depicted in FIG. 5 will now be discussed with reference to FIG. 6. The portion of the circuit located within the dashed box 602 is nearly identical to the circuit depicted in FIG. 1. The portion of the circuit within box 602 has therefor been previously described and will only be described again where necessary. The signal pad 408 in this exemplary embodiment is only used for driving signals out from the chip. However, as will be obvious to those of ordinary skill in the art, the circuit of FIG. 6 could easily be modified for use for both input and output, or could be logically implemented many other ways to achieve the same function.

The portion of the circuit within dashed box 503 will now be described. The circuit within dashed box 503 includes a latch circuit 613. Line 606 carries the PULL-DOWN CONTROL signal from line 114 to AND gate 608. The PULLDOWN CONTROL signal is also carried by line 610 to an inverter 612 located at the S (set) input of flipflop 614 and to an input of AND gate 616. Flipflop 614 is a standard level driven SRQ flip and will go to a high output (digital logic 1) at its Q output whenever a high level occurs at its S input. The output at its Q output will go to a low level (digital logic) whenever a high level occurs at its R (reset) input.

A FET 518 is electrically connected to line 108 via line 620. The other end of FET 518 is connected to ground. Line 622 labeled VARIABLE PULLDOWN CONTROL is connected to the gate of FET 518. Therefore, when line 622 is in its "high" state (a digital logic 1), FET 518 acts like a switch in the on position and line 620 is connected directly to ground. The PAD FEEDBACK line 420 provides a feedback signal from line 620 to an inverter 626 located at an input to AND gate 616. The output from AND gate 616 is connected to the R input (the reset) of flipflop 614.

Figure 1:
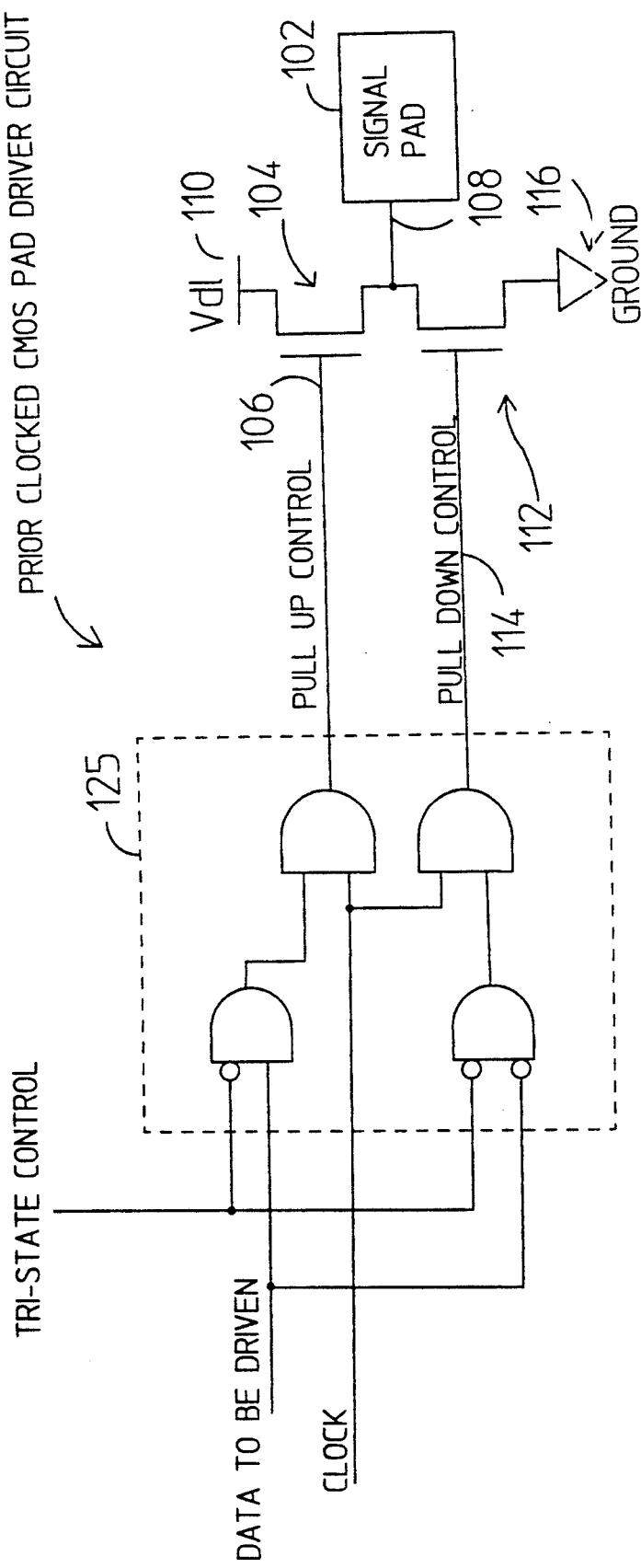
FIG. 1 is a schematic diagram of a prior art driver circuit.
Figure 6:
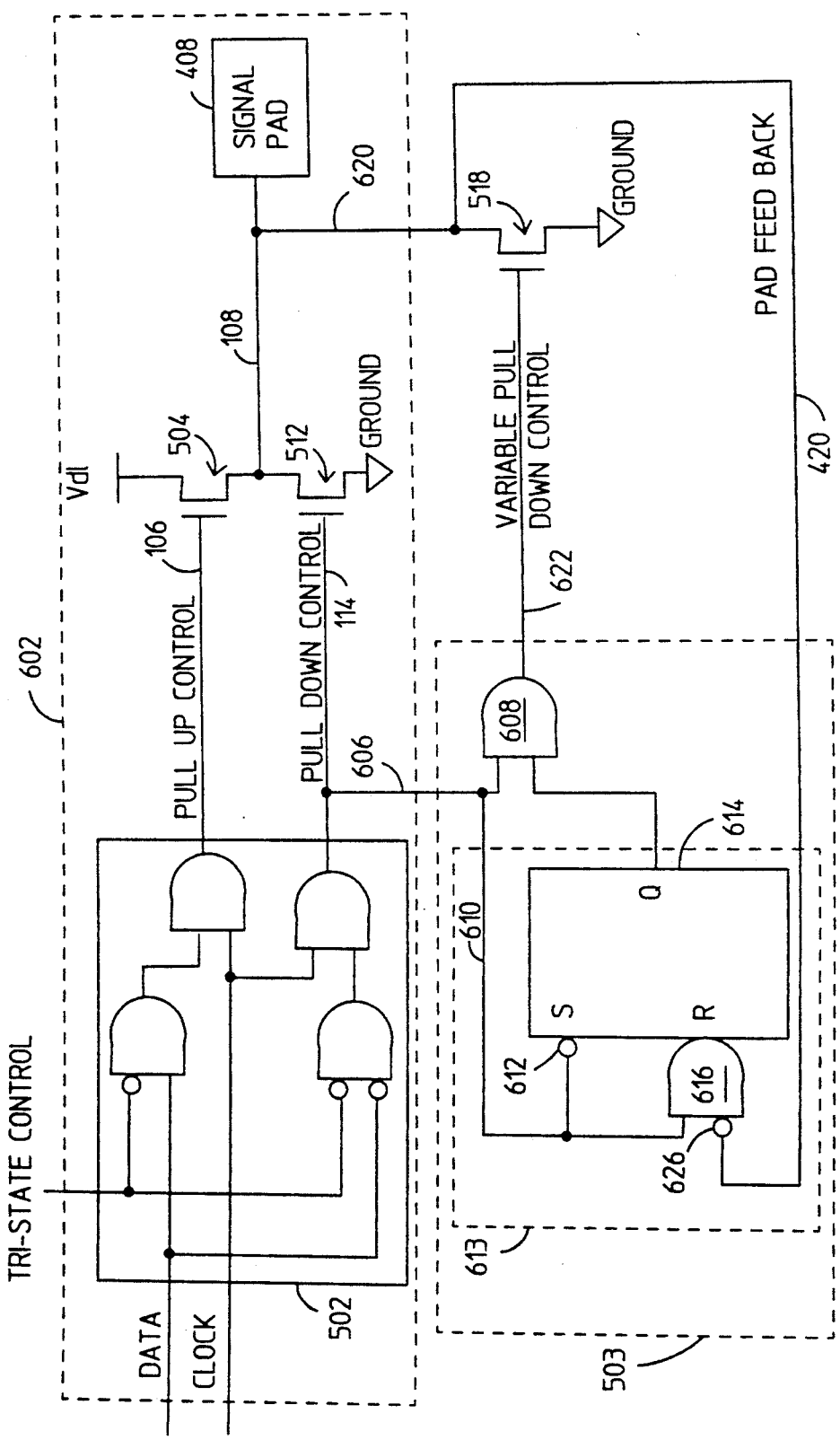
FIG. 6 is a schematic diagram of a preferred embodiment of the present invention.

The section of FIG. 6 in dashed box 602 functions in much the same way as the circuit in FIG. 1. When the PULLDOWN CONTROL line 114 is in its high state, FET 512 acts like a switch in the on position connecting line 108 to ground. Line 606 also provides a high input to AND gate 608 and line 610 provides a high input to the inverter 612 and to an input of AND gate 616.

Figure 7:
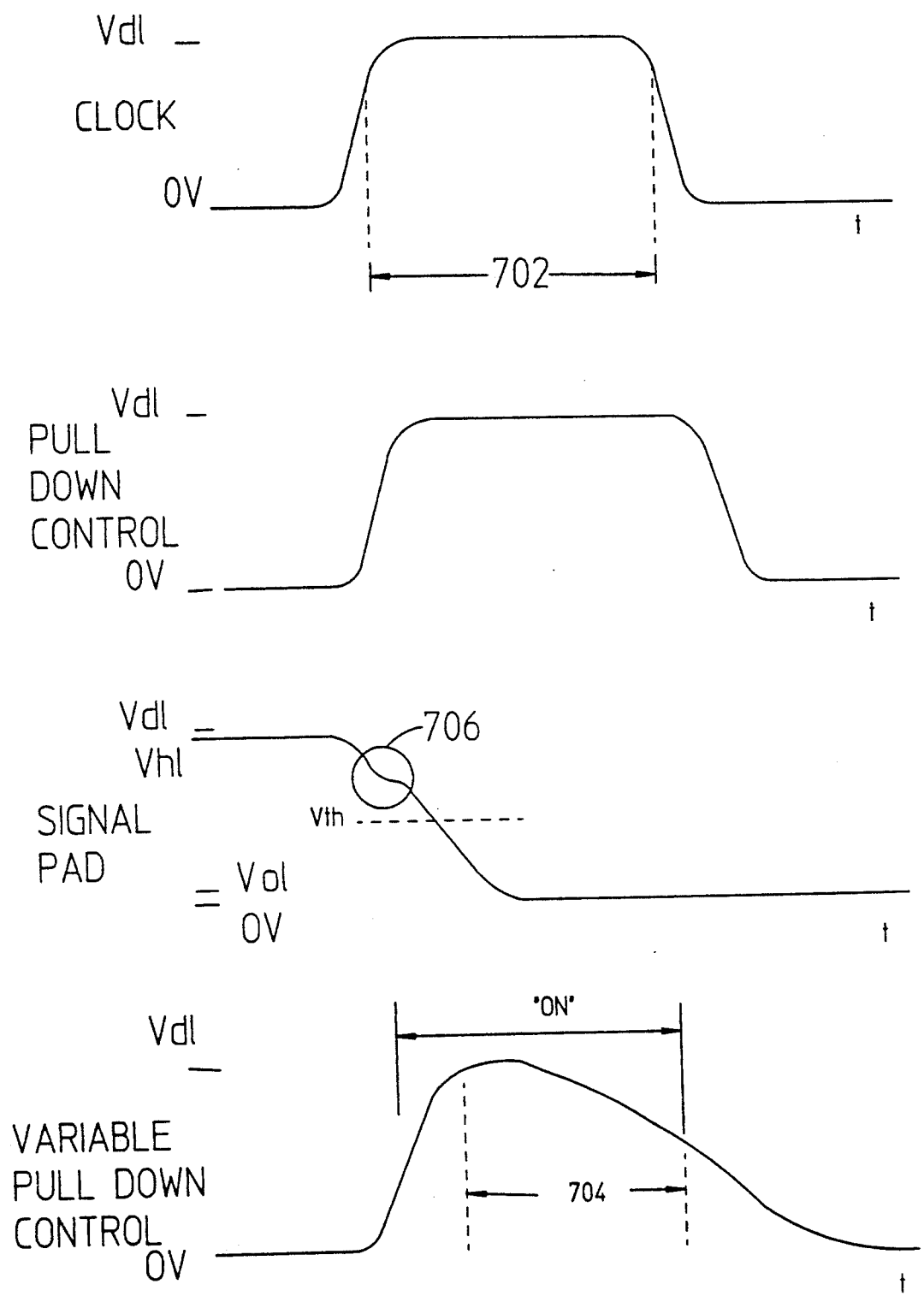
FIG. 7 is a timing diagram of the slow case for the circuit of FIG. 6.

The operation of the circuit depicted in FIG. 6 will be discussed for the slow case and the fast case with reference to FIGS. 7 and 8. In FIGS. 6 and 7 the vertical axis for each wave form is voltage and the horizontal axis is time. Turning first to FIG. 7, this figure shows a timing diagram of the signals CLOCK, PULLDOWN CONTROL and VARIABLE PULLDOWN CONTROL and the voltage present on the signal pad (SIGNAL PAD) in the slow case which was defined in the RELATED ART section of this document.

The Q output of flipflop 614 is initially high (a logical 1). That is a result of the signal PULLDOWN CONTROL having initially been a low value when the CLOCK was low. During clock pulse 702 the signal PULLDOWN CONTROL goes high (a logical 1), when data is low (a logical one). When the signal PULLDOWN CONTROL is high, FET 512 acts like a switch in the on position and begins pulling the voltage of the signal pad 408 towards ground, to Vol. When the PULLDOWN CONTROL signal reaches its high value, the inputs to AND gate 608 are both high. Therefore, the signal VARIABLE PULLDOWN CONTROL would go high. The signal VARIABLE PULL-DOWN CONTROL (on line 622) controls FET 518. Therefore, when the signal VARIABLE PULL-DOWN CONTROL is high, FET 518 acts like a switch in the on position and also begins pulling signal pad 408 down to voltage level Vol. Therefore, both FET's 512 and 518 act in parallel to pull signal pad 408 down towards ground, to voltage level Vol. Because FET 512 and FET 518 act in parallel, the resistance between signal pad 408 and ground is one half what it would be if a single FET was used.

When the voltage present on the signal pad reaches the level indicated as Vth (the threshold voltage of inverter 626) in FIG. 7, pad feedback 420 reaches the threshold voltage of inverter 626 and gate 616 then sees a high level at each of its inputs. The other high level is from the PULLDOWN CONTROL signal. AND gate 16 then presents a high level to the R input of flip flop 614. The output Q of flipflop 614 then goes low. The low output from flipflop 614 is then present at the input to AND gate 608 which causes the output from AND gate 608 to go low. The output from AND gate 608 is the signal VARIABLE PULLDOWN CONTROL.

The time interval indicated in FIG. 7 as 704 is the propagation delay from the time the signal pad reaches the level Vth to the time the signal VARIABLE PULLDOWN CONTROL leaves its high state and turns 518 "off". Time interval 704 is due to the propagation delay within the feedback logic 503. In the slow case, that delay is a significant amount of time.

Figure 2:
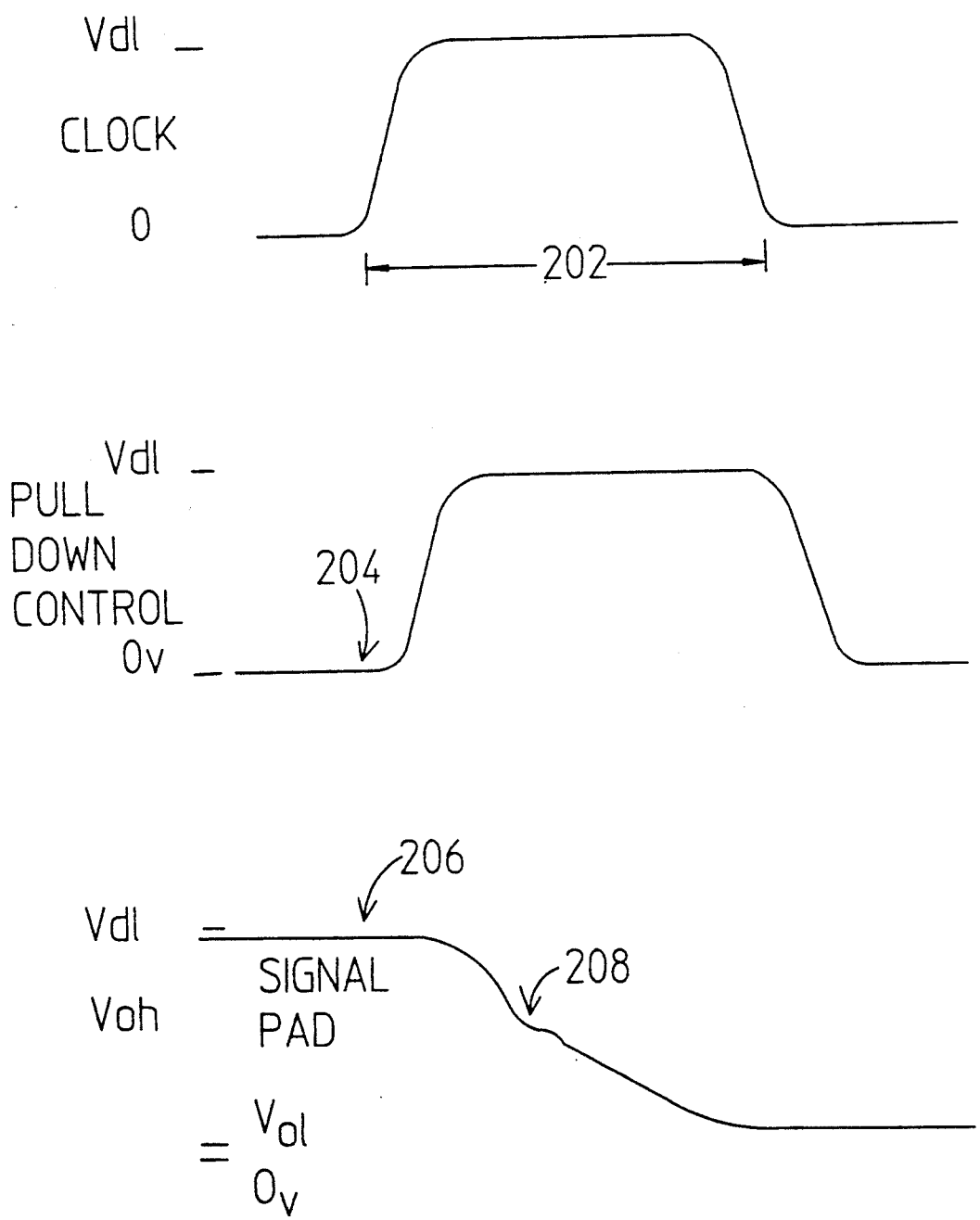
FIG. 2 is a timing diagram for the "slow" case for the circuit of FIG. 1.

In comparing the graph of the voltage present on the signal pad in FIG. 7 with the graph of the voltage present on the signal pad in FIG. 2, it is apparent that the two FET's 512 and 518 acting in parallel pull the voltage on the signal pad down towards ground to Vol much more quickly than the single FET 112 of FIG. 1. The ripple in the graph in the voltage present in the signal pad labeled 706 is caused by reflection along the transmission line 410.

Figure 8:
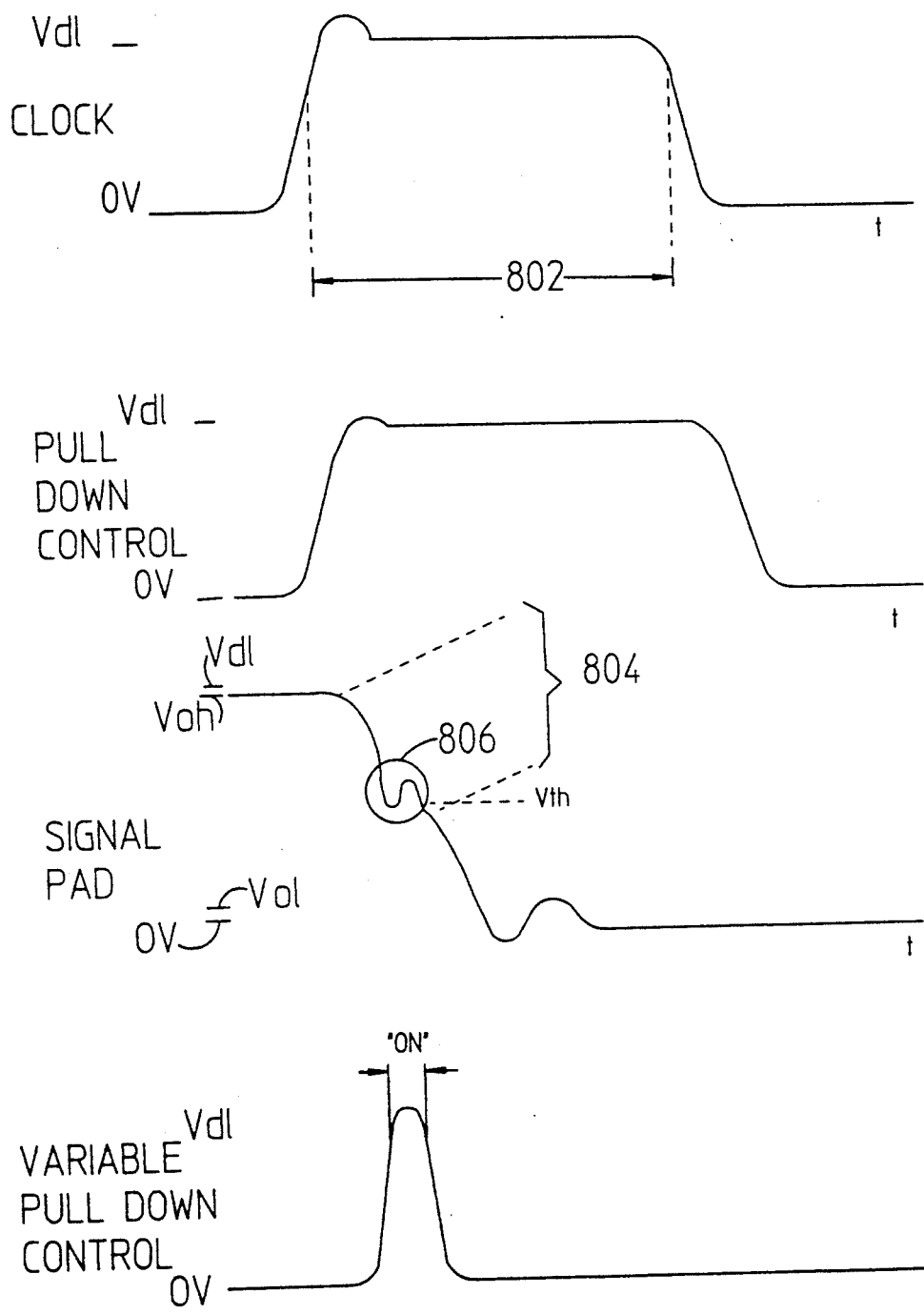
FIG. 8 is a timing diagram of the fast case for the circuit of FIG. 6.
Figure 9:
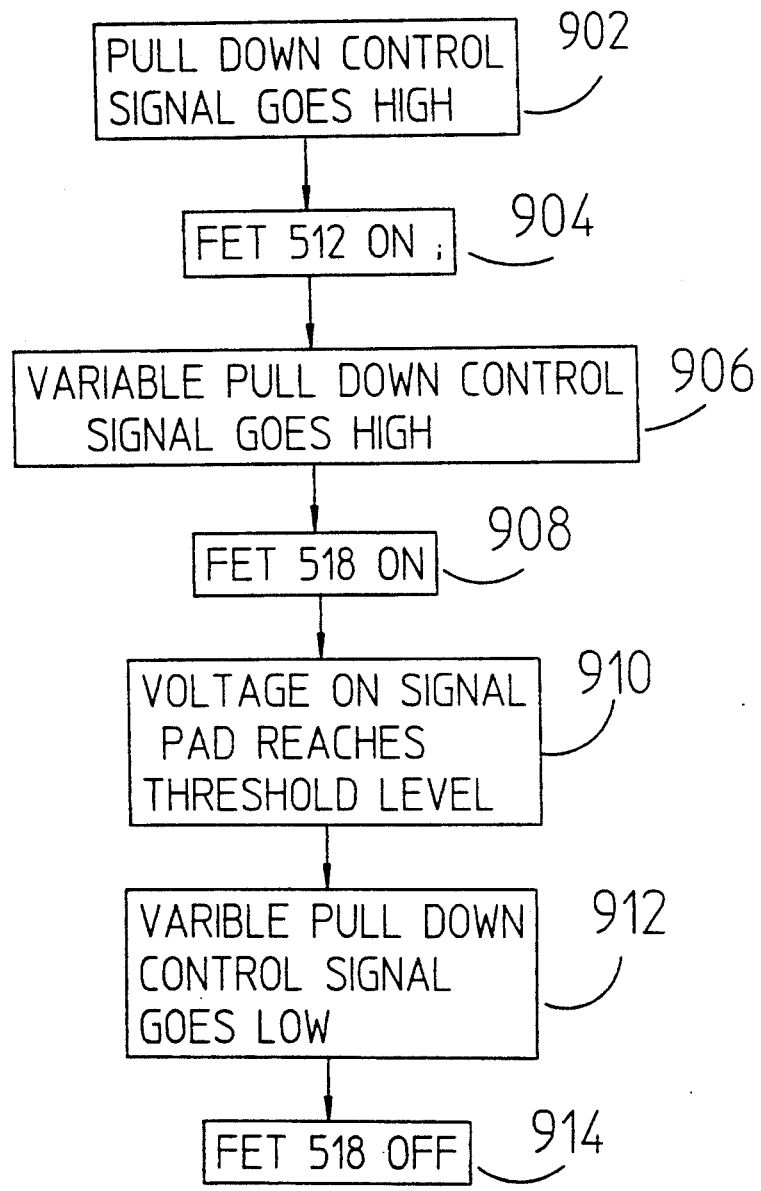
FIG. 9 is a flow diagram of the operation of a preferred embodiment of the present invention.

FIG. 8 is a timing diagram for the circuit of FIG. 6 in the fast case. The transition of the signal pad from a high level to a low level in the fast case will now be described with reference to FIGS. 6, 8 and 9. Again, the Q output of flipflop 614 is initially high (a logical 1). During clock pulse 802, the PULLDOWN CONTROL signal is at a high level (a logical 1) (box 902 of FIG. 9). When the signal PULLDOWN CONTROL is at its high level, FET 512 acts like a switch in the on position (box 904 of FIG. 9) and begins pulling the voltage of signal pad 408 down towards ground to voltage Vol. AND gate 608 sees the high level of the PULLDOWN CONTROL signal at one of its inputs and the high level from the output of flipflop 614 at its other input and therefore outputs a high level along 622, the VARIABLE PULLDOWN CONTROL signal (box 906 of FIG. 9). When the VARIABLE PULLDOWN CONTROL signal reaches its high state, it turns FET 518 on (box 908 of FIG. 9), and FET 518 also begins pulling the voltage on signal pad 408 down towards ground.

When the voltage present at the pad 408, fed back to inverter 622 via PAD FEEDBACK 420, reaches the level indicated the threshold level for inverter 626, Vth (box 910 in FIG. 9), inverter 626 outputs a high level to AND gate 616 which is also receiving a high level from the PULLDOWN CONTROL signal via lines 606 and 610. AND gate 616 then outputs a high level to the R(reset) input of flipflop 614 which causes the flipflop to reset and output a low level at its Q output. The low level output by flipflop 614 is input to AND gate 608 which then outputs a low level along line 622, the VARIABLE PULLDOWN CONTROL signal (box 912 of FIG. 9). The low level on line 622 turns FET 518 off (box 914 of FIG. 9). The interval during which FET 518 is "on" is labeled "on" in FIG. 8.

Figure 3:
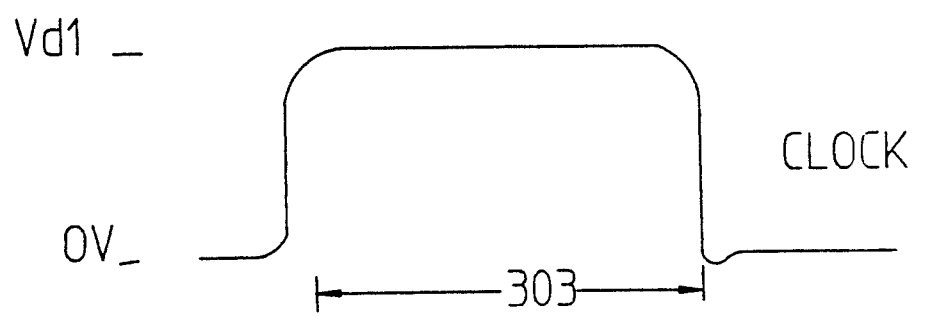
FIG. 3 is a timing diagram of the "fast" case for the circuit of FIG. 1.
Figure 3:
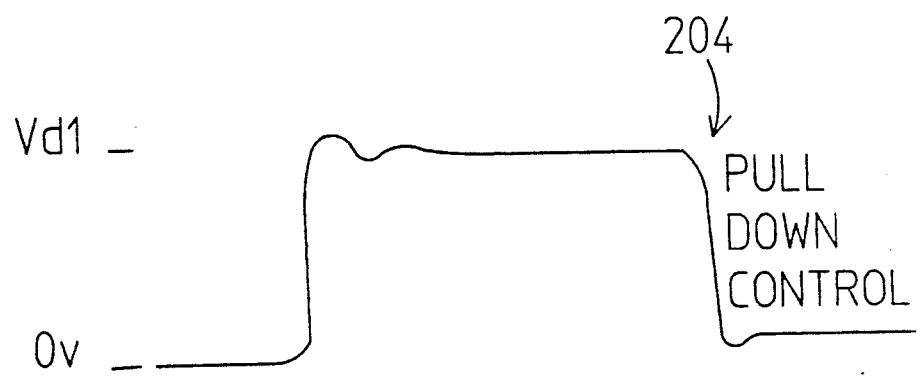
Figure 3:
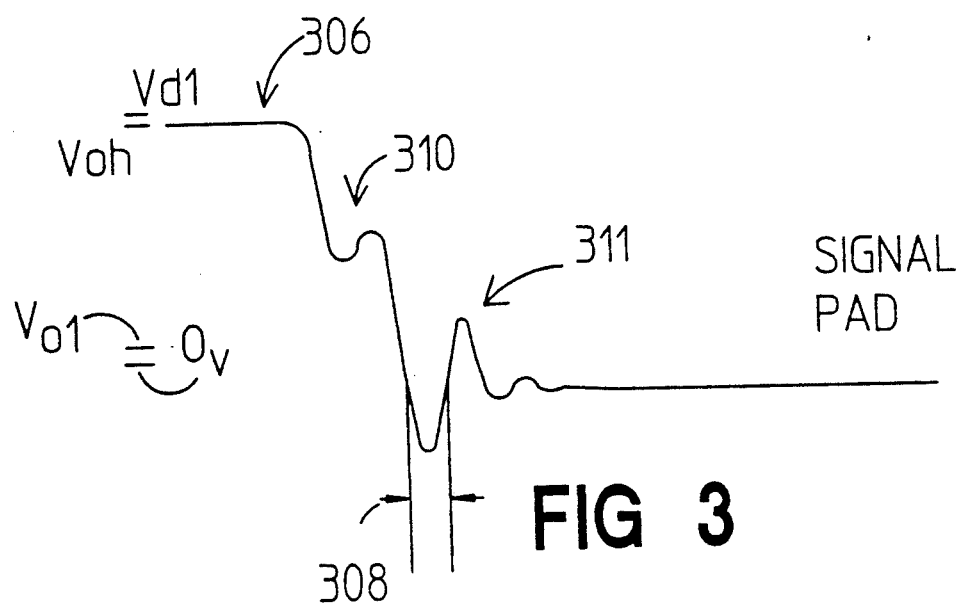

While both FET 512 and FET 518 are on, the voltage present on the signal pad falls rapidly as shown in the portion of the graph of the voltage present on the signal pad labeled 804. After the voltage on the signal pad reaches Vth and FET 518 turns off, the voltage present on the signal pad drops at a slower rate. The slower rate of change in the voltage present in the signal pad decreases the amount of ringing with less undershoot and without bouncing back as high when compared to the graph of the voltage on the signal pad as shown in FIG. 3. The small ripple in the voltage on the signal pad indicated at 806 is again caused by reflection of the transmission line 410.

In the present invention, in the slow case depicted in FIG. 7, the voltage on the signal pad is drawn more quickly down to the low level Vol than in earlier designs because FET's 512 and 518 operate in parallel and thereby decrease the resistance seen by the signal pad. On the other hand, in the fast case depicted in FIG. 8 for the circuit shown in FIG. 6, ringing is decreased by having FET 518 turn off after the voltage on the signal pad has been drawn down to Vth. In this manner, FET 512 along pulls the voltage on the signal pad down the rest of the way to Vol. FET 512 operating along has a larger resistance than the two FET's operating together or the single FET 112 of the previous design and, therefore, the voltage present on pad 408 falls less steeply which decreases the ringing caused by the voltage transition compared to prior circuits. In the circuit depicted in FIG. 6, the timing of the circuit can be adjusted by adjusting Vth which is most easily accomplished in the circuit depicted in FIG. 6 by varying the channel lengths of the FET's used to implement inverter 626.

As will be appreciated by those of ordinary skill in the art, the circuit depicted in FIGS. 4–6 can also be applied to the pullup control 106. Further, the particular logic circuits depicted in the control logic block 502 and the feedback control block 503 could easily be varied to equivalent logical circuits without departing from the spirit and scope of this invention.

The present invention is an output driver for an integrated circuit which compensates for process variations in environmental factors which alter the impedance of the circuit. The present invention varies the impedance of the driver circuit based upon the output voltage level present on the output pad. Therefore, the output driver circuit of the present invention compensates for process variations and interconnect parasitics. While preferred embodiments of the present invention have been set forth, various modifications, alterations and changes may be made without the parting from the spirit and scope of the present invention as defined in the following claims.

What is claimed is:

1. An output driver for driving a signal through a signal pad on a semiconductor device, the output driver comprising:

a first switch having an input, an output and a gate, the output coupled to the signal pad and the input coupled to a first preselected source;

a second switch having an input, an output and a gate, the output coupled to the signal pad and the input coupled to a second preselected source;

a control logic having a first and second output, the first output connected to the gate of the first switch and the second output connected to the gate of the second switch;

a third switch having an input, an output and a gate, the output coupled to the signal pad and the input coupled to a third preselected source; and a feedback control circuit having:
a first input coupled to the signal pad,
a second input coupled to the second output of the control logic, and
means for outputting a control signal to the third switch such that the third switch connects the signal pad to the third preselected source when the second switch connects the signal pad to the second preselected source and the third switch shows a high impedance as its output when the signal on the signal pad reaches a threshold level and maintains a high impedance at the output of third switch until the second switch shows a high impedance as its output.

2. The output driver of claim 1 wherein the first, second and third sources are voltage sources.

3. The output driver of claim 1 wherein the first, second and third switches are FETs.

4. The output driver of claim 1 wherein the first, second and third preselected sources are voltage sources.

5. The output driver of claim 1 wherein the second and third preselected sources are the same.

6. An output driver for driving a signal through a signal pad on a semiconductor device, the output driver comprising:
   a first switch having an input, an output and a gate, the output coupled to the signal pad and the input coupled to a first preselected source;
   a second switch having an input, an output and a gate, the output coupled to the signal pad and the input coupled to a second preselected source;
   a control logic having a first and second output, the first output connected to the gate of the first switch and the second output connected to the gate of the second switch;
   a third switch having an input, an output and a gate, the output coupled to the signal pad and the input coupled to a third preselected source; and
   a feedback control circuit having
      first and second inputs and an output, the first input coupled to the signal pad, the second input coupled to the second output of the control logic,
      means for outputting a control signal to the third switch such that the third switch connects the signal pad to the third preselected source when the second switch connects the signal pad to the second preselected source and the third switch shows a high impedance at its output when the signal on the signal pad reaches a threshold level, and
      a latch circuit having first and second input and an output and a logic gate having first and second inputs and an output, the first input of the latch circuit coupled to the signal pad thereby forming a feedback loop and the second input of the latch circuit coupled to the second output of the control logic, the first input of the logic gate coupled to the output of the latch circuit, the second input of the logic gate coupled to the second output of the control logic and the output of the logic gate coupled to the gate of the third switch.

7. The output driver of claim 6 wherein the latch circuit includes,
   an SRQ latch having an inverted S input, an R input and a Q output,
   an AND gate having an inverted input, a noninverted input and an output,
   wherein the Q output of the SRQ latch is coupled to the second input of the logic gate, the inverted S input of the SRQ latch is coupled to the second output of the control logic, the R input of the SRQ latch is coupled to the output of the AND gate, the inverted input of the AND gate is coupled to the signal pad, and the noninverted input of the AND gate is coupled to the second output of the control logic.

8. A method of driving a voltage signal from a starting level to one or more preselected levels through a signal pad of an integrated circuit, the method comprising the steps of:
   (1) generating a pulldown control signal which causes a first switch to close and causes a feed back logic circuit to generate a high variable pull down control signal which causes a second switch to close thereby connecting the signal pad to a first preselected level via two signal paths, one path including the first switch and the other path including the second switch; and
   (2) utilizing the feed back logic to detect when the signal on the signal pad reaches a threshold voltage, the feed back logic then generating a low variable pull down control signal which causes the second switch to turn off, including the steps of:
      (a) monitoring the level of the signal on the signal pad; and
      (b) turning the second switch off when the level of the signal on the signal pad reaches a threshold level, the threshold level located between the starting level and the preselected level
      (c) maintaining the second switch in the off state until after the first switch is turned off.

9. A method of driving a voltage signal from a starting level to one or more preselected levels through a signal pad of an integrated circuit, the method comprising the steps of:
   (1) generating a pulldown control signal which causes a first switch to close and causes a feed back logic circuit to generate a high variable pull down control signal which causes a second switch to close thereby connecting the signal pad to a first preselected level via two signal paths, one path including the first switch and the other path including the second switch; and
   (2) utilizing the feed back logic to detect when the signal on the signal pad reaches a threshold voltage, the feed back logic then generating a low variable pull down control signal which causes the second switch to turn off, including the steps of:
      (a) monitoring the level of the signal on the signal pad; and
      (b) turning the second switch to a high impedance when the level of the signal on the signal pad reaches a threshold level, the threshold level being between the starting level and the preselected level
      (c) maintaining the second switch in the high impedance state until after the first switch is turned to the high impedance state.

10. An output driver for a semiconductor device including an integrated circuit, the output driver comprising:
   a signal pad;
   first switching means for controllably connecting the signal pad to one of a first preselected voltage or to a high impedance;
   second switching means for controllably connecting the signal pad to one of a second preselected voltage or a high impedance;
   control means having first and second outputs, the first output coupled to the first switching means and the second output coupled to the second switching means, for controlling the first switching means and the second switching means;

third switching means for controllably connecting the signal pad to one of a third preselected voltage or a high impedance; and feedback means for outputting a control signal to the third switch such that the third switch connects the signal pad to the third preselected voltage when the second switch connects the signal pad to the second preselected voltage and the third switch shows a high impedance as its output when the signal on the signal pad reaches a threshold level and maintains a high impedance at the output of third switch until the second switch shows a high impedance at its output having;

a first input coupled to the second output of the control means, and a second input coupled to the signal pad.

11. The output driver of claim 10 wherein the control means further includes input means for receiving data signals and clock signals from the integrated circuit.

12. An output driver for a semiconductor device including an integrated circuit, the output driver comprising:

a signal pad;

first switching means for controllably connecting the signal pad to one of a first preselected voltage or to a high impedance;

second switching means for controllably connecting the signal pad to one of a second preselected voltage or a high impedance;

control means having:

first and second outputs, the first output coupled to the first switching means and the second output coupled to the second switching means, for controlling the first switching means and the second switching means, and input means for receiving data signals and clock signal from the integrated circuit;

third switching means for controllably connecting the signal pad to one of a third preselected voltage or a high impedance; and feedback means having:

first and second inputs and an output, the second input coupled to the signal pad, the first input coupled to the second output of the control means and the output coupled to the third switching means, for controlling the third switching means, and a latching means having first and second input and an output and a logic gate means having first and second inputs and an output, the first input of the latching means coupled to the signal pad thereby forming a feedback loop and the second input of the latching means coupled to the second output of the control means, the first input of the logic gate means coupled to the output of the latching means, the second input of the logic gate coupled to the second output of the control means and the output of the logic gate coupled to the third switching means.

13. The output driver of claim 12 wherein the latch means includes an SRQ latch with an inverted S input, an R input and a Q output, and an AND gate with one inverted input, one noninverted input and an output, the inverted S input coupled to the second output of the control means, the R input coupled to the output of the AND gate, the inverted input of the AND gate coupled to the signal pad and the noninverted input of the AND gate coupled to the second output of the control means.

* * * * *